(12) United States Patent
Vaisman

(10) Patent No.: US 9,300,022 B2
(45) Date of Patent: Mar. 29, 2016

(54) VAISMAN BALUNS AND MICROWAVE DEVICES EMPLOYING THE SAME

(71) Applicant: Scientific Components Corporation, Brooklyn, NY (US)

(72) Inventor: Aaron Vaisman, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 104 days.

(21) Appl. No.: 14/244,997

(22) Filed: Apr. 4, 2014

(65) Prior Publication Data

US 2015/0303547 A1    Oct. 22, 2015

Related U.S. Application Data

(60) Provisional application No. 61/808,850, filed on Apr. 5, 2013.

(51) Int. Cl.
| | |
|---|---|
| *H03H 7/42* | (2006.01) |
| *H01P 5/10* | (2006.01) |
| *H01P 3/08* | (2006.01) |

(52) U.S. Cl.
CPC . *H01P 5/10* (2013.01); *H03H 7/422* (2013.01)

(58) Field of Classification Search
CPC ............... H01P 3/08; H01P 5/10; H03H 7/42
USPC .................................... 333/24 R, 25, 26, 238
See application file for complete search history.

(56) References Cited

U.S. PATENT DOCUMENTS

| | | | |
|---|---|---|---|
| 5,061,910 A | 10/1991 | Bouny | |
| 6,683,510 B1 | 1/2004 | Padilla | |
| 7,250,828 B2 | 7/2007 | Erb | |
| 7,605,672 B2 | 10/2009 | Kirkeby | |
| 7,633,353 B2 * | 12/2009 | Okabe | H01P 5/10 333/24 R |
| 7,772,941 B2 | 8/2010 | Yeung et al. | |
| 7,880,557 B2 | 2/2011 | Jiang | |
| 8,427,388 B2 * | 4/2013 | Fahs | H01F 17/0006 333/25 |
| 8,502,620 B2 * | 8/2013 | Lu | H01F 21/12 333/25 |
| 8,575,731 B2 * | 11/2013 | Ujita | H01L 23/64 257/379 |
| 8,912,090 B2 * | 12/2014 | Marki | H05K 1/0243 29/831 |
| 2007/0120621 A1 | 5/2007 | Kirkeby | |
| 2012/0056297 A1* | 3/2012 | Akhtar | H01F 21/12 257/531 |

OTHER PUBLICATIONS

K. Sachse, The Scattering Parameters and Directional Coupler Analysis of Characteristically Terminated Asymmetric Coupled Transmission Lines in an Inhomogeneous Medium, IEEE Transactions on Microwave Theory and Techniques, Apr. 1990, pp. 417-425, vol. 38, No. 4.

(Continued)

*Primary Examiner* — Dean Takaoka
(74) *Attorney, Agent, or Firm* — Lawrence G. Fridman, Esq.

(57) ABSTRACT

A planar balun comprises a balun input, a first balun output, a second balun output, two primary coupled lines with a first cross-sectional area disposed on an inhomogeneous medium, and two secondary coupled lines with a second cross-sectional area, the second coupled lines disposed on an inhomogeneous medium. Each of the primary coupled lines are coupled to one of the secondary coupled lines with a predetermined uniform surface space therebetween. The first cross-sectional area and the second cross-sectional area are unequal, thereby producing pairs of asymmetric coupled lines.

22 Claims, 11 Drawing Sheets

(56) References Cited

OTHER PUBLICATIONS

M.K. Krage and G. I. Haddad, Characteristics of Coupled Microstrip Transmission Lines—I: Coupled-Mode Formulation of Inhomogeneous Lines, IEEE Transactions on Microwave Theory and Techniques, Apr. 1970, pp. 217-222, vol. MTT-18, No. 4.

M.K. Krage and G.I. Haddad, Krage and Haddak, Characteristics of Coupled Microstrip Transmission Lines—II, Evaluation of the Coupled-Line Parameters, IEEE Transactions on Microwave Theory and Techniques, Apr. 1970, pp. 222-228, vol. MTT-18, No. 4.

V.K. Tripathi, Asymmetric Coupled Transmission Lines in an Inhomogeneous Medium, IEEE Transactions on Microwave Theory and Techniques, Sep. 1975, pp. 734-739, vol. MTT-23, No. 9.

S. Kal, D. Bhattacharya and N.B. Chakraborti, Normal-Mode Parameters of Microstrip Coupled Lines of Unequal Width, IEEE Transactions on Microwave Theory and Techniques, Feb. 1984, pp. 198-200, vol. MTT-32, No. 2.

K. S. Ang and I.D. Robertson, Analysis and Design of Impedance-Transforming Planar Marchand Baluns, IEEE Transactions on Microwave Theory and Techniques, Feb. 2001, pp. 402-406, vol. 49, No. 2.

C-S Lin, P-S Wu, M-C Yeh, J-S Fu, H-Y Chang, K-Y Lin, and H.Wang, Analysis of Multiconductor Coupled-Line Marchand Baluns for Miniature MMIC Design, IEEE Transactions on Microwave Theory and Techniques, Jun. 2007, pp. 1190-1199, vol. 55, No. 6.

T. Johansen and V. Krozer, Analysis and Design of Lumped Element Marchand Baluns, May 2008, MIKON 2008, 17th International Conference on, pp. 1-4.

J. Frei, X-D Cai and S. Muller, Multipart S-Parameter and T- Parameter Conversion with Symmetry Extension, IEEE Transactions on Microwave Theory and Techniques, Nov. 2008, pp. 2493-2504, vol. 56, No. 11.

* cited by examiner

VAISMAN BALUNS AND MICROWAVE DEVICES EMPLOYING THE SAME

RELATED APPLICATIONS

This application claims priority to and benefit of U.S. Provisional Patent Application Ser. No. 61/808,850 filed on Apr. 5, 2013, the entire content of which is hereby incorporated by reference in its entirety.

FIELD OF THE INVENTION

This invention relates to baluns and, more particularly, to baluns in the form of monolithic microwave integrated circuits (MMICs) and low temperature co-fired ceramic (LTCC) circuits with asymmetric uniform coupled line sections in inhomogeneous media.

BACKGROUND OF THE INVENTION

A balun transforms power between differential (balanced) and single ended (unbalanced) circuits or conversely between single ended and differential circuits, and is commonly used in radio frequency (RF) and microwave frequency circuits such as mixers, push pull amplifiers, and frequency doublers. A Marchand balun is a passive balun configured as a transmission line type of transformer often used in microwave applications, which provides both a wide bandwidth and DC isolation from primary to secondary. In the past, Marchand baluns and particularly planar topologies have played an important role in the development of several different circuit applications such as mixers, frequency doublers and push-pull amplifiers by providing a wideband conversion capability from an unbalanced input to balanced outputs. Traditionally, active baluns have been widely employed in monolithic microwave integrated circuit (MMIC) applications; however, they do compromise the system's dynamic range by generating extra noise.

Passive MMIC components have been loaded with an increasing variety of planar Marchand baluns ranging from purely lumped solutions to lumped-distributed and fully distributed circuits. Although the latter ones show the greatest bandwidth performance, the requirement of two quarter wave-length sections made the baluns more suitable for the higher frequency bands of the radio frequency (RF) spectrum in order to lower fabrication costs. The latest such use of planar Marchand baluns resulting from advances in MMIC technology processes and materials have allowed for profitable fully distributed planar Marchand balun circuit implementations at frequencies as low as 1 GHz and can provide for at least one to four octaves of bandwidth. Several exemplary balun devices are discussed hereinbelow.

U.S. Pat. No. 5,061,910 entitled BALUN TRANSFORMERS teaches a balun transformer formed by printed tracks on a printed circuit board. The balanced side of the balun is entirely on one side of the board resulting in symmetrical parasitic effects in the balanced limbs. However, there is no mention about implementing the coupled sections in an asymmetrical manner in order to overcome these parasitic effects.

U.S. Pat. No. 6,683,510 entitled ULTRA-WIDEBAND PLANAR COUPLED SPIRAL BALUN teaches a coupled transmission line balun construction employing two pairs of planar interleaved spiral coils formed on an electrically insulating or semi-insulating substrate defining a planar structure, and having a shunted capacitor joining the two coils of the secondary. The balun provides an ultra-wide bandwidth characteristic for MMIC devices. However, this balun's performance is limited by the symmetrical structure of the coupled sections.

U.S. Pat. No. 7,250,828 entitled COMPACT BALUN teaches a distributed backwards-wave balun for use in wireless, cellular handsets and radios and in RF modules. The input to the balun is presented on the inner side of the first coupled section. However, this balun's performance is limited by the symmetrical structure of the coupled sections.

U.S. Pat. No. 7,605,672 entitled INVERTED STYLE BALUN WITH DC ISOLATED DIFFERENTIAL PORTS teaches a balun including a first coupler structure having a first port of a balanced port pair and an unbalanced port, and a second coupler structure including a second port of the balanced port pair. The second coupler port structure is connected to the first coupler structure such that the second port of the balanced port pair is DC isolated from the first port of the balanced port pair without decoupling components. However, this balun's performance is limited by the symmetrical structure of the coupled sections.

U.S. Pat. No. 7,772,941 entitled ULTRA-WIDEBAND/DUALBAND BROADSIDE-COUPLED COPLANAR STRIPLINE BALUN teaches a balun utilizing asymmetric coplanar striplines. Although this balun has been implemented with asymmetrical sections, those are coplanar stripline asymmetric and nonuniform, relying on broadside coupling phenomena realized exclusively with straight lines.

U.S. Pat. No. 7,880,557 entitled HYBRID MARCHAND/BACK-WAVE BALUN AND DOUBLE-BALANCED MIXER USING SAME teaches a hybrid Marchand/backwave balun and a double balanced mixer using the hybrid balun. This hybrid (lumped/distributed) balun has the disadvantage of switching between topologies at different frequencies, which is problematic for matching and phase control.

U.S. Patent Publication Number 2007/0120621 entitled VERTICAL INTER-DIGITAL COUPLER teaches a vertical inter-digital coupler employed in radio-frequency and/or microwave components, and particularly for RF and/or microwave coupled transmission line components. However, this coupler's performance is limited by the symmetrical structure of the coupled sections.

While design optimization for homogeneous transverse electromagnetic (TEM) lines is established, when inhomogeneities in the dielectric occur, the methodology is no longer valid. Such inhomogeneities occur when the electromagnetic wave carried by a microstrip line exists partly in the dielectric substrate, and partly in the air above it. In general, the dielectric constant of the substrate will be different (and greater) than that of the air, so that the wave is travelling in an inhomogeneous medium. In consequence, the propagation velocity is somewhere between the speed of radio waves in the substrate, and the speed of radio waves in air. Thus, a new theory for the design of asymmetrical coupled line directional couplers in inhomogeneous media has been developed, and is discussed in the paper Aaron Vaisman, "A generalized S-Parameter Analysis of Novel Planar Marchand Balun Topologies" IEEE Wamicon Conference, Invited Paper, 2013 which is herein incorporated by reference in its entirety. The practical application of this theory as discussed hereinbelow results in the present invention.

A higher-performing balun would be realized in the form of monolithic microwave integrated circuits with asymmetric uniform coupled line sections embedded, designed specifically for use in inhomogeneous media, and optimized by applying a mathematical scattering parameter analysis providing for proper output matching and concomitant better phase unbalance performance.

SUMMARY OF THE INVENTION

A planar balun comprises a balun input, a first balun output, a second balun output, two primary coupled lines with a first cross-sectional area, the primary coupled lines being disposed on a first dielectric medium, and two secondary coupled lines with a second cross-sectional area, the secondary coupled lines being disposed on a second dielectric medium. Each of the primary coupled lines is coupled to one of the secondary coupled lines with a predetermined uniform surface space therebetween, and the first cross-sectional area and the second cross-sectional area are unequal, thereby producing pairs of asymmetric coupled lines.

According to another aspect of the present invention, the primary coupled lines are embedded in the first dielectric medium and the secondary coupled lines are embedded in the second dielectric medium, wherein the first dielectric medium comprises a portion of a first inhomogeneous medium and the second dielectric medium comprises a portion of a second inhomogeneous medium, and the first dielectric medium includes a first dielectric substrate, and the second dielectric medium includes a second dielectric substrate.

According to yet another aspect of the present invention, the primary coupled lines are overlaid upon a dielectric substrate forming a portion of a first inhomogeneous medium and the secondary coupled lines are overlaid upon a dielectric substrate forming a portion of a second inhomogeneous medium.

According to still another aspect of the present invention, the first inhomogeneous medium and the second inhomogeneous medium are the same.

According to a further aspect of the present invention, the balun has a selected center operating frequency and further comprises a pair of couplers each formed from one of the primary coupled lines and one of the secondary coupled lines with each coupled line being ¼ wavelength in length, According to a yet further aspect of the present invention, the primary coupled lines from each one of the pair of couplers are connected together in series and the secondary coupled lines are connected to ground, and wherein the optimum coefficient of coupling is determined by the equation:

$$k_{opt,I} = \frac{\sqrt{Z_{01}} \sqrt{Z_{02}}}{\sqrt{Z_{01}Z_{02} + 2Z_1Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

According to a still further aspect of the present invention, the secondary coupled lines from each one of the pair of couplers are connected together in series and the primary coupled lines are connected to ground, and wherein the optimum coefficient of coupling is determined by the equation:

$$k_{opt,II} = \frac{\sqrt{2} \sqrt{Z_{01}} \sqrt{Z_{02}}}{\sqrt{2Z_{01}Z_{02} + Z_1Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

According to an additional aspect of the present invention, the first dielectric substrate and second dielectric substrate are selected from the group consisting of LTCC material, integrated circuit dielectric substrate material, or pc board material, and the portion of the first dielectric medium and the second dielectric medium other than the first dielectric substrate and the second dielectric substrate are selected from the group consisting of LTCC material, integrated circuit dielectric material, pc board material, pc board type solder mask, or air.

According to a yet additional aspect of the present invention, a method of forming a balun with asymmetric coupled lines comprises the steps of selecting a dielectric substrate, selecting a conductive material to be applied upon the dielectric substrate in order to form primary coupled lines and secondary coupled lines, selecting a dielectric medium to cover the primary coupled lines and the secondary coupled lines, calculating an optimal cross-sectional area for the primary coupled lines and a different optimal cross-sectional area for the secondary coupled lines, and manufacturing the balun with the selected materials and the calculated parameters.

According to a still additional aspect of the present invention, the method of forming a balun further comprises the steps of selecting a first dielectric medium to cover the primary coupled lines and selecting a second dielectric medium to cover the secondary coupled lines.

According to a further additional aspect of the present invention, the method of forming a balun further comprises the step of embedding the conductive material within the dielectric substrate.

According to a yet further additional aspect of the present invention, the method of forming a balun further comprises the steps of pairing primary and secondary coupled lines in order to form pairs of couplers, selecting a center operating frequency, designing each coupled line to be ¼ wavelength in length, selecting characteristic impedances for the primary and secondary coupled lines, and fine tuning the spacing between the primary and secondary coupled lines in order to obtain the optimal coupling condition.

According to a still further additional aspect of the present invention, the method of forming a balun further comprises the steps of connecting the primary coupled lines in series, connecting the secondary coupled lines each to ground, and determining the optimum coefficient of coupling by using the equation:

$$k_{opt,I} = \frac{\sqrt{Z_{01}} \sqrt{Z_{02}}}{\sqrt{Z_{01}Z_{02} + 2Z_1Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

According to an another further additional aspect of the present invention, the method of forming a balun further comprises the steps of connecting the secondary coupled lines in series, connecting the primary coupled lines each to ground, and determining the optimum coefficient of coupling by using the equation:

$$k_{opt,II} = \frac{\sqrt{2}\sqrt{Z_{01}}\sqrt{Z_{02}}}{\sqrt{2Z_{01}Z_{02} + Z_1Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
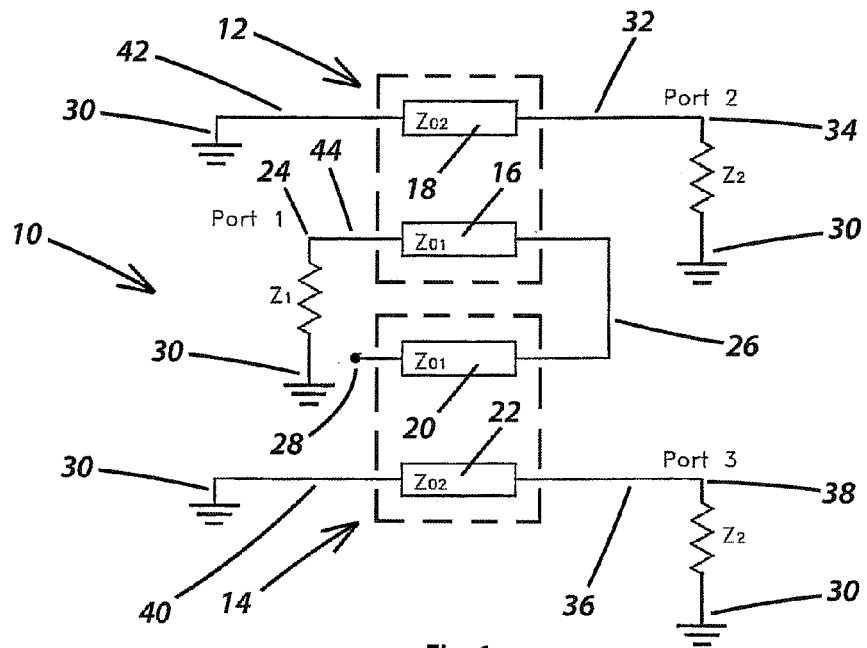
FIG. 1 shows a Topology I Vaisman balun with asymmetric implementation.

The planar Marchand Balun is well known in the art and generally consists of two symmetrically coupled line sections which may be realized using microstrip coupled lines, Lange couplers, multilayer coupled structures or spiral coils.

In the general approach to broadening the bandwidth of the Marchand Balun, coupled line sections with tight coupling are desired. Such a coupling may be achieved by increasing the mutual capacitance between the coupled lines which in turn can be accomplished by either decreasing the spacing between them, performing a broadside coupling within a multilayer structure or implementing a multi-conductor coupled structure. Constraints such as space, cost, profitability and the possibility for physical realization would have to be evaluated for deciding the type of implementation.

Among the above-mentioned considerations, the two microstrip coupled lines implementation may be the most common one due to its simple design, easy to realize, relatively low area consumption and thus improved profitability, in addition to being able to achieve a very acceptable performance.

The planar Vaisman baluns, as shown in the corresponding topologies, consist of a combination of two substantially identical asymmetric coupled lines disposed in a dielectric medium, which may be either an homogeneous or an inhomogeneous medium. The dielectric medium may be realized with a dielectric substrate selected from the group consisting of LTCC material, integrated circuit dielectric substrate material, or pc board material, and if required, an appropriate dielectric covering above the coupled lines. If LTCC material is the dielectric medium, the appropriate coverings include (but are not limited to) LTCC material and air. If integrated circuit dielectric substrate material is the dielectric medium, the appropriate coverings include (but are not limited to) integrated circuit dielectric material and air. If pc board material is the dielectric medium, the appropriate coverings include (but are not limited to) pc board material, pc board type solder mask, and air.

Each asymmetrical coupled line section is a quarter-wave long at the center frequency of operation. The topologies I and II employed herein are structured using asymmetric coupled lines with the primary and secondary lines having different cross-sectional areas. A common path in the secondary between the two coupled sections is combinable with an RF choke to provide an IF signal tap off in either a balanced (Topology I) or unbalanced (Topology II) fashion. Both topologies shown herein are implementable with either symmetric or asymmetric coupled line couplers; however, the ability to implement with asymmetric line coupled lines is enabled by the novel theoretical analysis taught in the above-mentioned paper and as implemented herewith, constitutes the exemplary mode of the present invention.

In the novel theoretical analysis associated with the present invention and as implemented herewith, the S-Parameter expressions for the asymmetric coupler are subtly different from those for the symmetrical counterpart thereof. The equations associated with the invention provide an opportunity for the designer that, once the center frequency of operation is known along with the input and output impedances, to optimize the coefficient of coupling in baluns with asymmetrically coupled lines. The optimization is available in a first topology, wherein the primary lines of the two couplers are connected in series, and also in a second topology, wherein the secondary lines of the two couplers are connected in series.

In the baluns hereof, the asymmetric coupled line couplers are configured, so that the cross-sectional areas of the primary and secondary lines and the uniform spacing therebetween is optimized. This results in better input return loss, smaller amplitude unbalance, and better phase unbalance performance. Because there is greater control of design variables, the electrical performance of the balun is more easily fine-tuned and miniaturization is more easily accomplished. For example, for miniaturization, a coupled line may be of increased weight and the optimized uniform spacing reduced, an approach not available in the design of symmetrical structures.

As it was stated before, baluns are key components in balanced mixers, frequency doublers and push pull-amplifiers. In diode based mixers and frequency multipliers for example, the balun performance has a direct effect on conversion loss, port to port isolation and return loss. Since passive diode mixers may be intended to operate well into the millimeter wave frequency spectrum given that current diode technologies easily allow achieving cutoff frequencies in the terahertz range, then, the bandwidth constraint will be mostly imposed by the balun's bandwidth.

The Marchand topology is well known in the art for broadband operation, and is a popular type of balun for use in passive high-frequency circuits. Achieving optimal performance with Marchand baluns requires an understanding of which parameters most strongly contribute to the optimal performance, and how to model and tune these parameters. S-Parameters have generally become the standard in modeling linear passive networks. By stating the S-Parameters of a balun in terms of physical and transmission line parameters, those parameters may be translated into an existing technology. Topology I when implemented with symmetrical cross-sectional features is known in the art. However, the present invention implements Topology I with asymmetrical cross-sectional features, which require a different analysis to achieve optimal performance, and if correctly implemented, will provide superior performance over that provided by the symmetrical implementation.

The present invention is also implemented as Topology II, with asymmetric coupled lines. Topology II is optimized for being able to tap off the IF port in mixers without degrading the balun's performance. Topology II is a variant of Topology I and thus can be used as a regular balun too.

The planar Marchand balun is realized as a Vaisman balun with a combination of two identical asymmetric coupled line sections embedded in dielectric mediums which may be homogeneous or inhomogeneous, each coupled line section being a quarter-wave long at the center frequency of operation. It is also possible to realize the Vaisman balun with differing inhomogeneous mediums for each of the primary and secondary lines or the two asymmetric coupled line sections, generally by selecting coatings other than air for covering the otherwise exposed surfaces of the transmission lines, and thereby gaining additional design freedom with the ability to specify parameters including both the permittivity and the thickness of these coatings. It is also possible for the dielectric substrate portions of the dielectric mediums under or embedding the transmission lines or coupled line sections to be different, whether the lines are embedded in or formed on top of their particular dielectric substrate. The transmission lines are preferably formed from conductive metals including but not limited to copper, silver, gold, and alloys thereof.

Since in the great majority of cases Marchand baluns are required to realize impedance transformation between input to outputs while providing a 180° phase shift between the two outputs, by employing asymmetric couplers within the balun structure, extra degrees of freedom may be achieved in the balun design, thus improving the balun performance.

It is desirable to achieve a −3 dB power splitting between balanced ports (180° apart) while at the same time transforming the input impedance to an output so that optimum Return Loss is presented to the source and loads. The result of the theory taught in the above-mentioned paper is the pair of equations:

$$k_{opt,I} = \frac{\sqrt{Z_{01}} \sqrt{Z_{02}}}{\sqrt{Z_{01}Z_{02} + 2Z_1Z_2}}$$

and $$k_{opt,II} = \frac{\sqrt{2} \sqrt{Z_{01}} \sqrt{Z_{02}}}{\sqrt{2Z_{01}Z_{02} + Z_1Z_2}}$$

Where $Z_1$ is the unmatched source's impedance, $Z_2$ is the unmatched output port's impedance and $k_{opt,I}$ and $k_{opt,II}$ are the optimum coupling coefficients for Topology I and II respectively, allowing for equal split and impedance conversion from $Z_1$ to $Z_2$. This will hold true as long as $0<k<1$. This condition implies that $0<Z_1, Z_2<\infty, Z_1<\infty$ and, $0<Z_2$. The same range of possible values applies for $Z_{01}$ and $Z_{02}$.

One problem frequently encountered with edge coupled structures is that by setting $Z_{01}=Z_1$ and $Z_{02}=Z_2$ as is often the desired case, it may become very difficult to physically realize the balun, especially in technologies not allowing for distances between conductors to be closer than 8 μm. The situation actually gets worse if low values of $Z_1$ and $Z_2$ are given summed up with requirements for relatively low frequency operation (i.e. below 4 GHz).

In practice, it is truly difficult to realize microstrip based edge couplers with tighter voltage coupling than −4.8 dB. Thus, ideally, we would prefer that $$k_{opt,I} = \frac{\sqrt{Z_{01}} \sqrt{Z_{02}}}{\sqrt{Z_{01}Z_{02} + 2Z_1Z_2}} \leq \frac{1}{\sqrt{3}}$$

and $$k_{opt,II} = \frac{\sqrt{2} \sqrt{Z_{01}} \sqrt{Z_{02}}}{\sqrt{2Z_{01}Z_{02} + Z_1Z_2}} \leq \frac{1}{\sqrt{3}}$$

Higher values of $Z_1$ and $Z_2$ are desired in order to not compromise the realizability of the coupler. By having greater impedance values for the port's terminations, the lines of the coupler can be made thinner (higher $Z_{01}$ and $Z_{02}$) and yet a −4.8 dB voltage coupling ratio could still be achieved. It is generally easier to physically implement in microstrip technology Topology I over Topology II for the same impedance values, but Topology's I electrical performance may be more susceptible to $Z_1$ and $Z_2$ changes than is Topology II, specifically for the lower values of $Z_1$ and $Z_2$.

In the realization of a symmetric coupler, the non-idealities of the coupler are translated in a twofold manner to the balun's performance and the designer is required to change both the spacing and the widths of the coupling segments to accomplish an optimal coupling condition, whereas in the realization of the asymmetric coupler, once the characteristic impedances have been selected for the coupler's lines, the designer is only required to fine tune the spacing between the lines in order to obtain the optimal coupling condition. It must be noted that this simplicity is in part a trade-off against sacrificing the input Return Loss low sensitivity to the balun's termination impedances.

By using asymmetric couplers within the baluns, overall performance may be less sensitive to dispersion effects and mode's velocity differences. Therefore, a broader band directivity and return loss performance may be achieved when compared to the symmetric implementation.

Additionally, the independence to choose $Z_{01}$ and $Z_{02}$ gives a clear advantage in realizability since there is an extra degree of freedom to choose from, instead of the single parameter $Z_0$ required to be specified whenever symmetric couplers are employed.

Parameter optimization is preferably done by using CAD software. Four sets of analysis results obtained by applying fully automated CAD optimization are shown for designs intended to be implemented on the same substrate, namely GaAs within a Heterojunction Bipolar Transistor third generation (HBT3) technology design environment. The substrate to be considered is specified as having $\in_r$=12.9, height H=75 µm, conductor thickness T=1 µm and loss tangent Tan δ=0.00028.

To overcome the limitations of Marchand and back-wave baluns, the present invention combines the DC-bias-preference and wide band advantages of Marchand and back-wave baluns. In addition, the invention overcomes the fabrication difficulties of strip-line baluns and can be readily implemented with most available planar and semiconductor integrated-circuit fabrication process. The balun hereof is utilizable in impedance transforming/matching networks as well as providing better input return losses, smaller amplitude imbalances, and easier miniaturization.

There is shown in FIG. 1 a Topology I Vaisman balun 10 using pairs of identical inhomogeneous asymmetric microstrip coupled transmission line elements. Balun 10 includes a first pair of coupled sections 12 and a second pair of coupled sections 14. Coupled sections 12 includes a first primary section 16 and a first secondary section 18. Coupled sections 14 include a second primary section 20 and a second secondary section 22. First primary section 16 has one end connected by line 44 to input port 24 while the other end is connected directly via line 26 to second primary section 20 whose other end is open at 28.

First secondary section 18 has one end 42 connected to ground 30 and the other end 32 connected to one of the balanced or differential output ports 34. Second secondary section 22 also has one end 36 connected to the other differential or balanced output port 38. The other end 40 of secondary section 22 is connected to ground 30.

Figure 2:
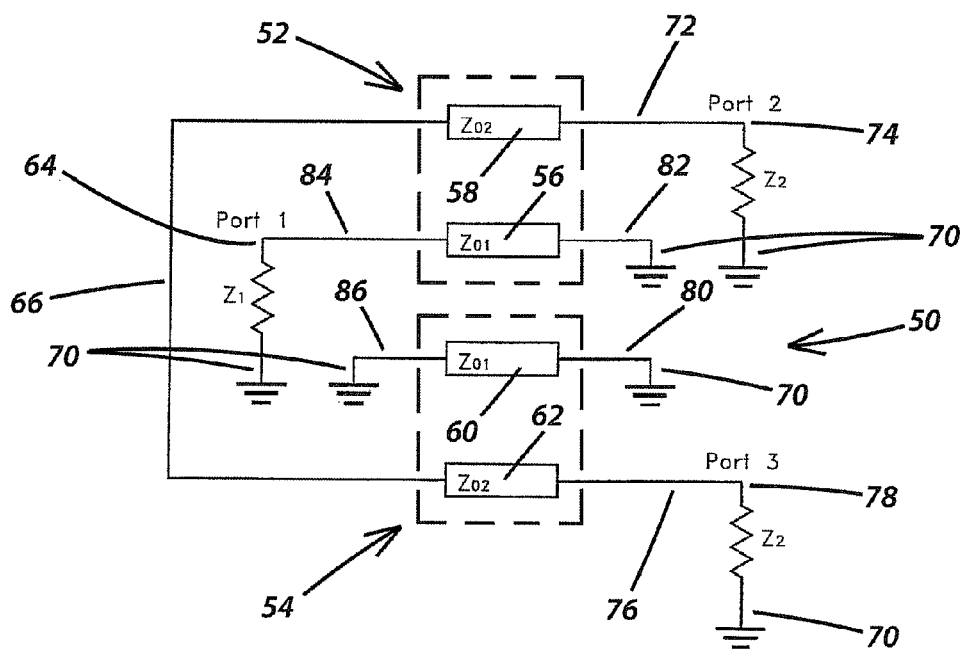
FIG. 2 shows a Topology II Vaisman balun with asymmetric implementation.

There is shown in FIG. 2 a Topology II distributed or complementary type Vaisman balun 50 using asymmetrical coupled transmission line elements, configured to permit tapping off IF signals without negatively impacting the circuit's inherent performance such as amplitude unbalance throughout a wideband operation. The balun 50 has a first set of coupled sections 52 and a second set of coupled sections 54. The balun 50 has its first primary section 56 connected at one end by line 84 to port 64, but at its other end instead of being connected directly to second primary section 60 is connected to ground 70 through line 82, and both ends of second primary section 60 are connected to ground 70, through lines 80 and 86. The ends of each secondary sections 58 and 62, connect through lines 72 and 76 to ports 74 and 78 respectively. However, the other ends of each secondary sections 58 and 62 are not connected to ground as was the case with the balun 10 of FIG. 1, but are connected to each other through line 66. Other than those specific differences, the balun shown in FIG. 2 has the same connections as the balun shown in FIG. 1.

Although the single ended ports 24 and 64 are referred to as the input port and the differential or balanced ports 34, 38, 74 and 78 are referred to as the output ports, this is not a necessary limitation of the invention, as is the case with every balun both conventional and those involving the invention described herein. The balun in concept can be bi-directional, that is, the single ended port may be the input and the balanced or differential ports may be the output as shown throughout this disclosure but the balanced or differential ports may as well be the inputs and the single ended port may be the output.

Figure 3:
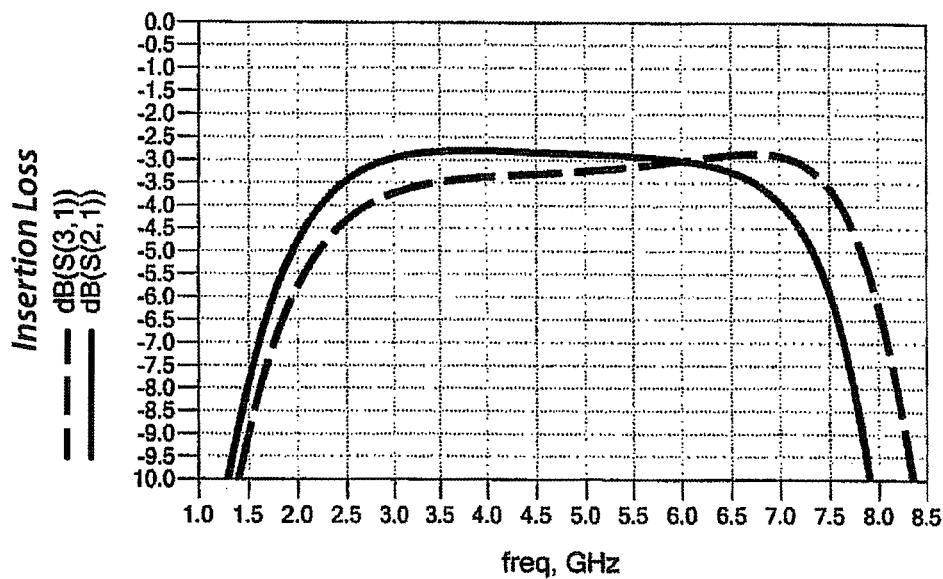
FIG. 3 shows an Insertion Loss graph for Topology I with asymmetric implementation.
Figure 4:
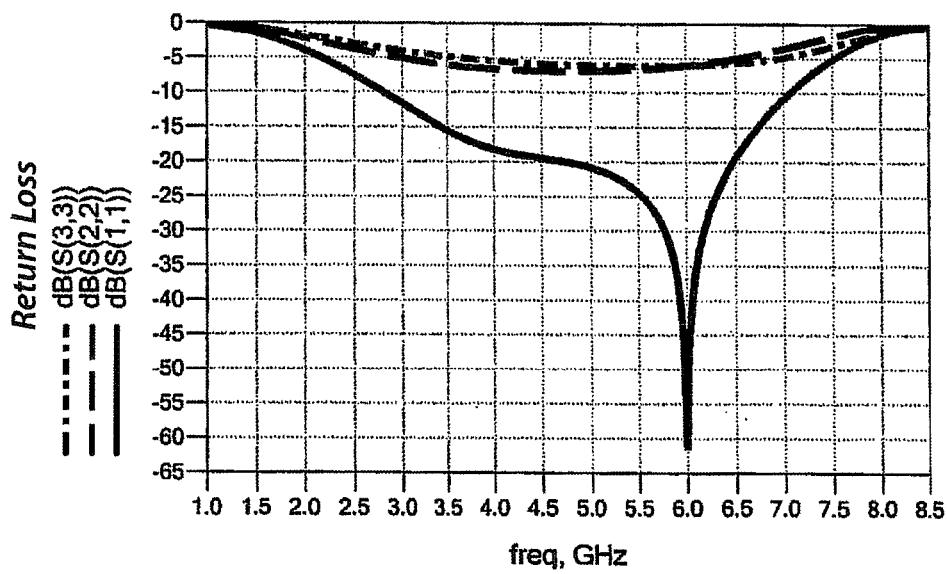
FIG. 4 shows a Return Loss graph for Topology I with asymmetric implementation.
Figure 5:
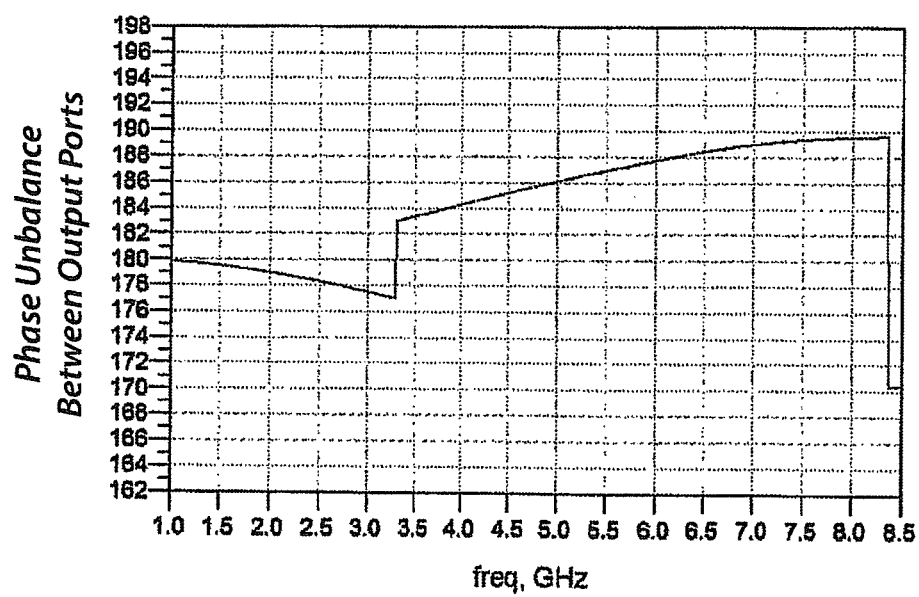
FIG. 5 shows Phase Unbalance between output ports for Topology I with asymmetric implementation.

FIG. 3 shows the insertion loss for a Topology I Vaisman balun with asymmetric coupled line sections. FIG. 4 shows the return loss for a Topology I Vaisman balun with asymmetric coupled line sections. FIG. 5 shows the phase unbalance between output ports for a Topology I Vaisman balun with asymmetric coupled line sections.

Figure 6:
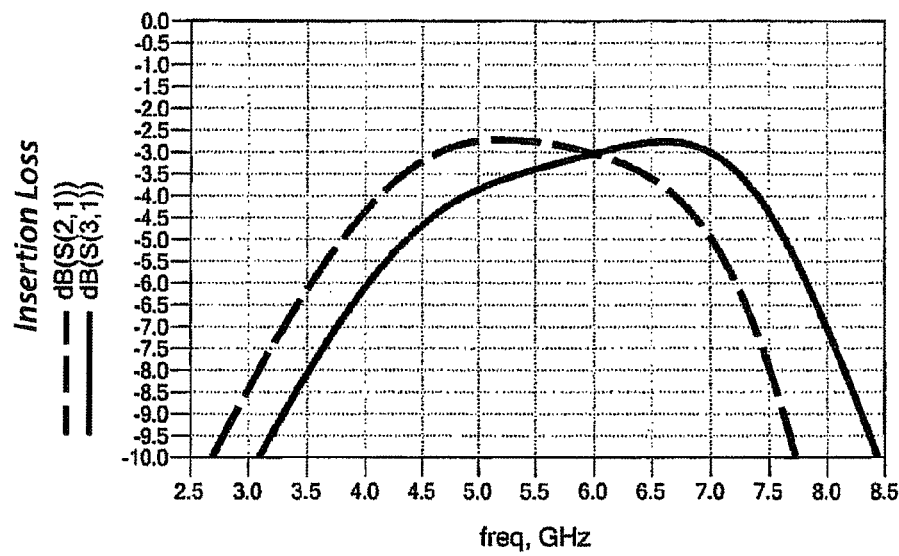
FIG. 6 shows an Insertion Loss graph for Topology II with asymmetric implementation.
Figure 7:
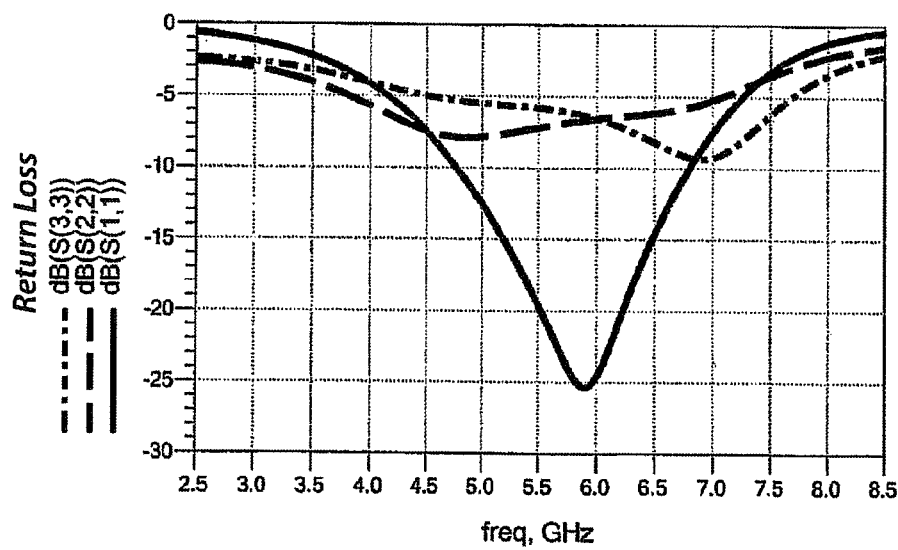
FIG. 7 shows a Return Loss graph for Topology II with asymmetric implementation.
Figure 8:
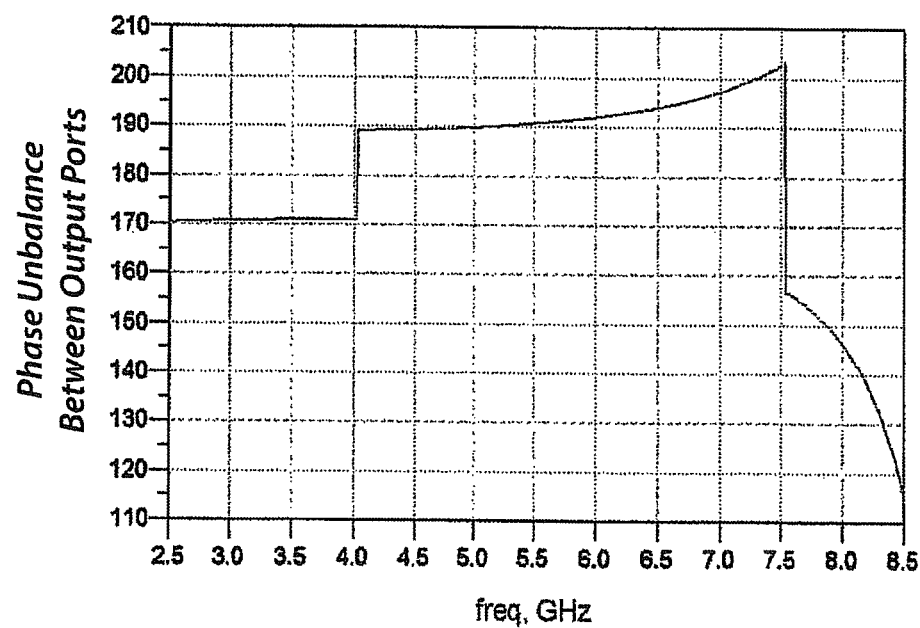
FIG. 8 shows Phase Unbalance between output ports for Topology II with asymmetric implementation.

FIG. 6 shows the insertion loss for a Topology II Vaisman balun with asymmetric coupled line sections. FIG. 7 shows the return loss for a Topology II Vaisman balun with asymmetric coupled line sections. FIG. 8 shows the phase unbalance between output ports for a Topology II Vaisman balun with asymmetric coupled line sections.

Figure 9:
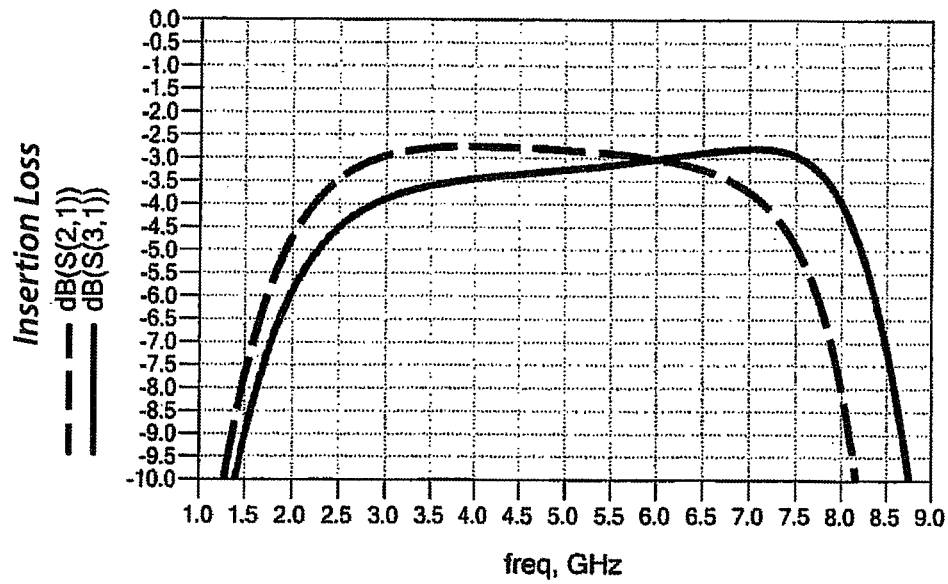
FIG. 9 shows an Insertion Loss graph for Topology I with symmetrical implementation.
Figure 10:
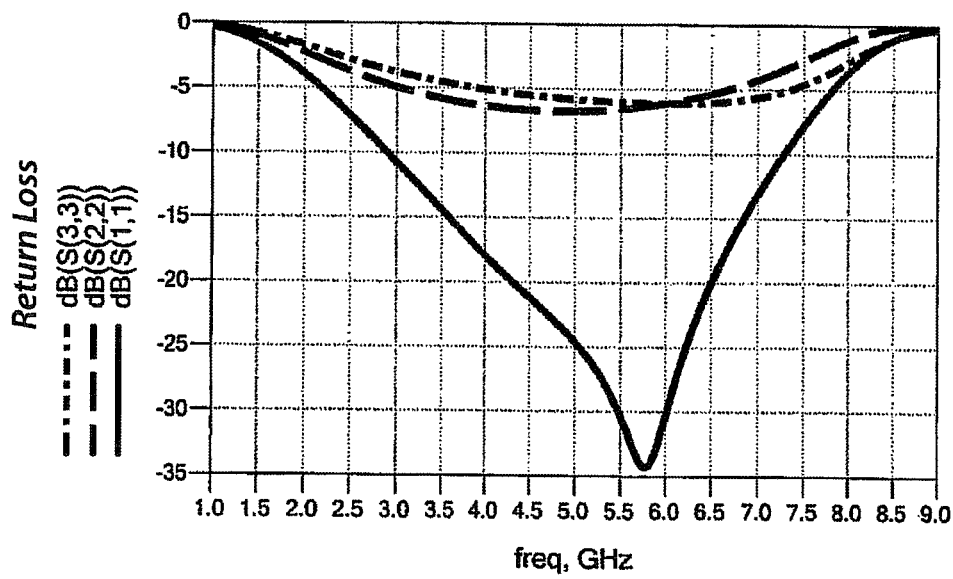
FIG. 10 shows a Return Loss graph for Topology I with symmetrical implementation.
Figure 11:
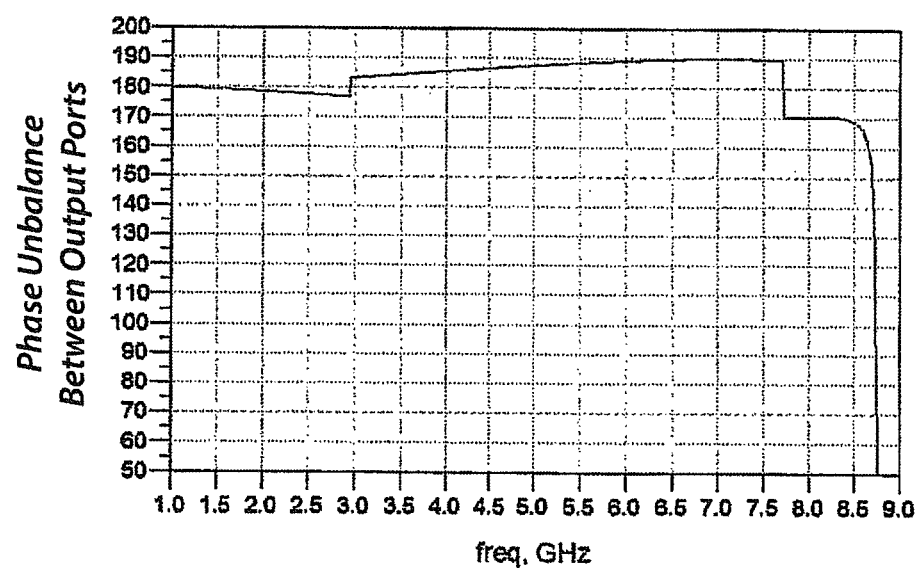
FIG. 11 shows Phase Unbalance between output ports for Topology I with symmetrical implementation.

FIG. 9 shows the insertion loss for a Topology I Vaisman balun with symmetrical coupled line sections. FIG. 10 shows the return loss for a Topology I Vaisman balun with symmetrical coupled line sections. FIG. 11 shows the phase unbalance between output ports for a Topology I Vaisman balun with symmetrical coupled line sections.

Figure 12:
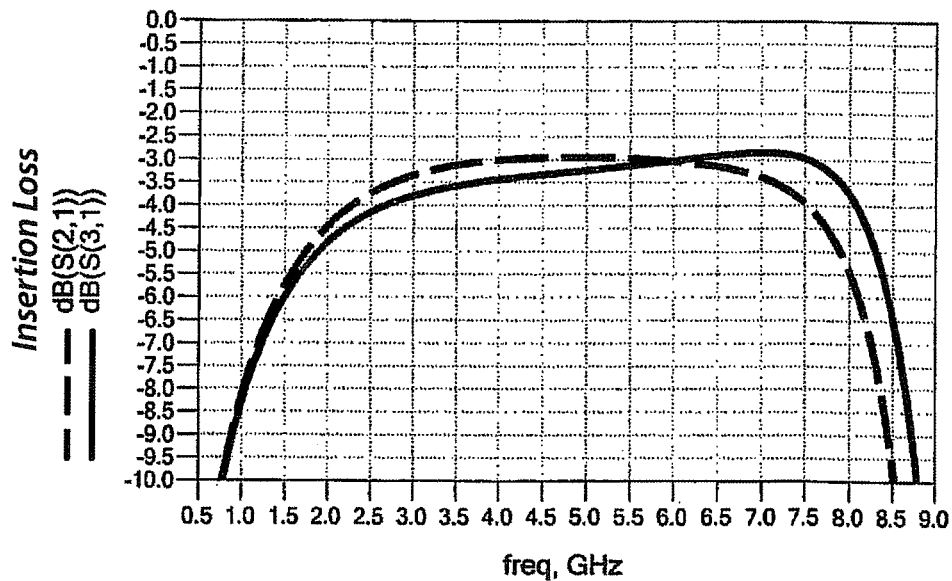
FIG. 12 shows an Insertion Loss graph for Topology II with symmetrical implementation.
Figure 13:
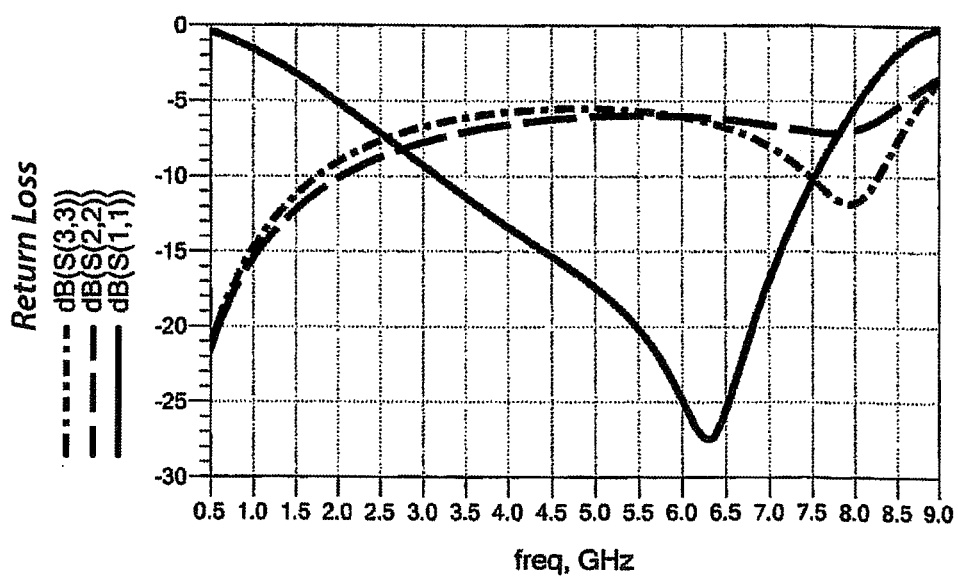
FIG. 13 shows a Return Loss graph for Topology II with symmetrical implementation.
Figure 14:
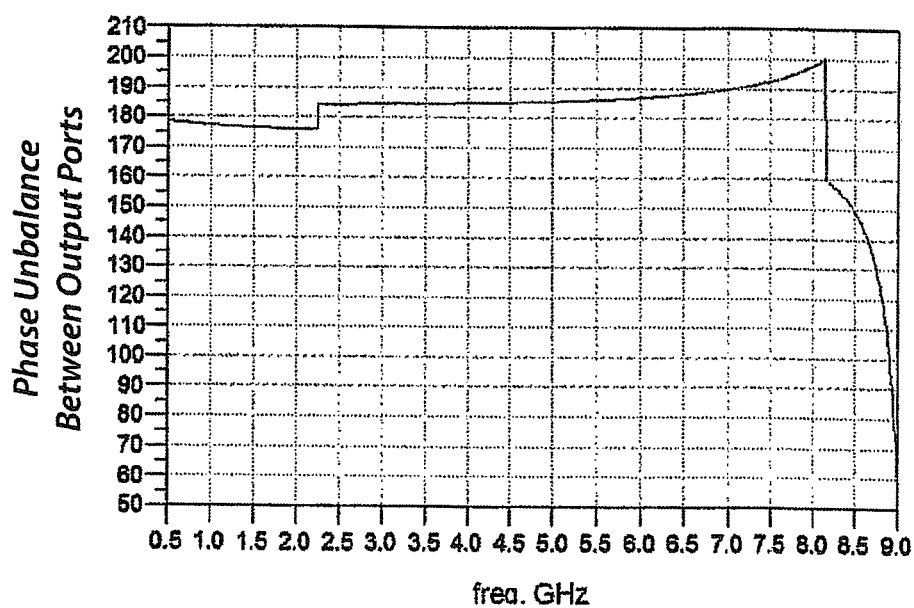
FIG. 14 shows Phase Unbalance between output ports for Topology II with symmetrical implementation.

FIG. 12 shows the insertion loss for a Topology II Vaisman balun with symmetrical coupled line sections. FIG. 13 shows the return loss for a Topology II Vaisman balun with symmetrical coupled line sections. FIG. 14 shows the phase unbalance between output ports for a Topology II Vaisman balun with symmetrical coupled line sections.

The simulation results shown in FIGS. 3-14 show how both topologies perform in a broadband fashion. In particular, the results shown in FIG. 3 demonstrate that Topology I is best implemented by using asymmetric coupled line directional couplers. A comparison of Topology I against Topology II shows that overall better performance is achieved through Topology I implemented with asymmetric couplers and in particular, a greater bandwidth of operation has been demonstrated as well as an improved amplitude unbalance. Input return loss is also shown to be significantly improved. Within Topology I, it is noticed that although the asymmetric version provides roughly the same bandwidth as the symmetric one, the Input Return Loss as well as the Amplitude Unbalance performances are superior with the asymmetric implementation. The primary utility of Topology II is demonstrated in the electrical performance experiencing minimal impact from the IF tapping networks shown in FIGS. 15-16 as long as the low pass filter networks used for the tap offs do not excessively load the balun.

Figure 15:
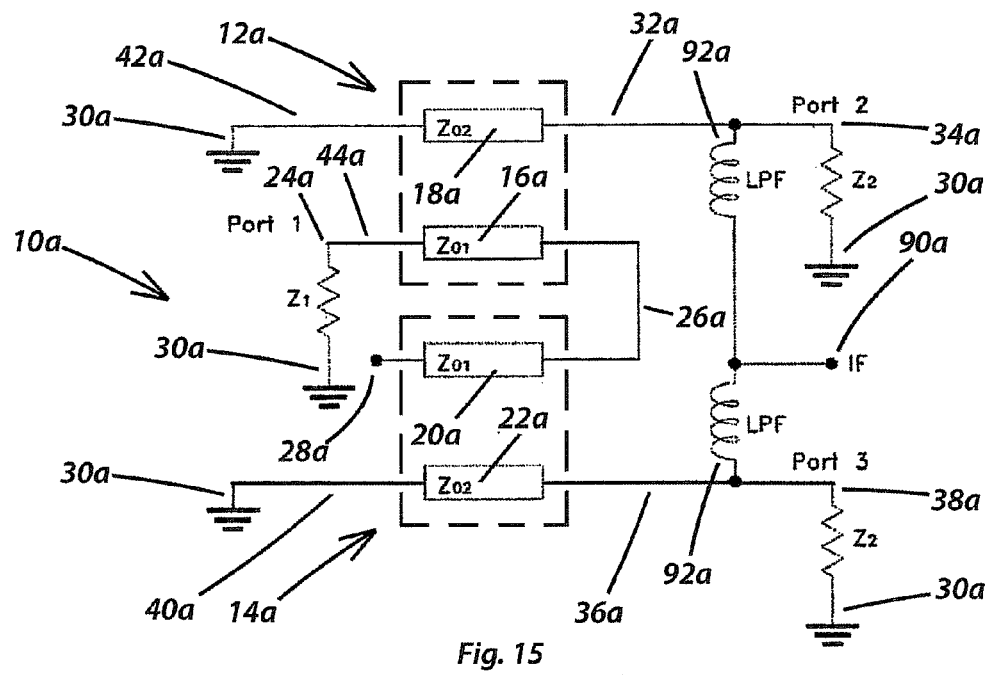
FIG. 15 shows Topology I with a balanced IF tap off.

There is shown in FIG. 15 a Topology I Vaisman balun 10a using asymmetrical transmission line elements, and configured for use as a mixer. Balun 10a includes a first pair of coupled sections 12a and a second pair of coupled sections 14a. Coupled sections 12a includes a first primary section 16a and a first secondary section 18a. Coupled sections 14a include a second primary section 20a and a second secondary section 22a. Primary section 16a has one end connected by line 44a to input port 24a while the other end is connected directly via line 26a to second primary section 20a whose other end is open at 28a. Lowpass filter inductors 92a connect from ports 34a and 38a to the IF port 90a.

First secondary section 18a has one end 42a connected to ground 30a and the other end 32a connected to one of the balanced or differential output ports 34a. Second secondary section 22a also has one end 36a connected to the other differential or balanced output port 38a. The other end 40a of secondary section 22a is connected to ground 30a.

Figure 16:
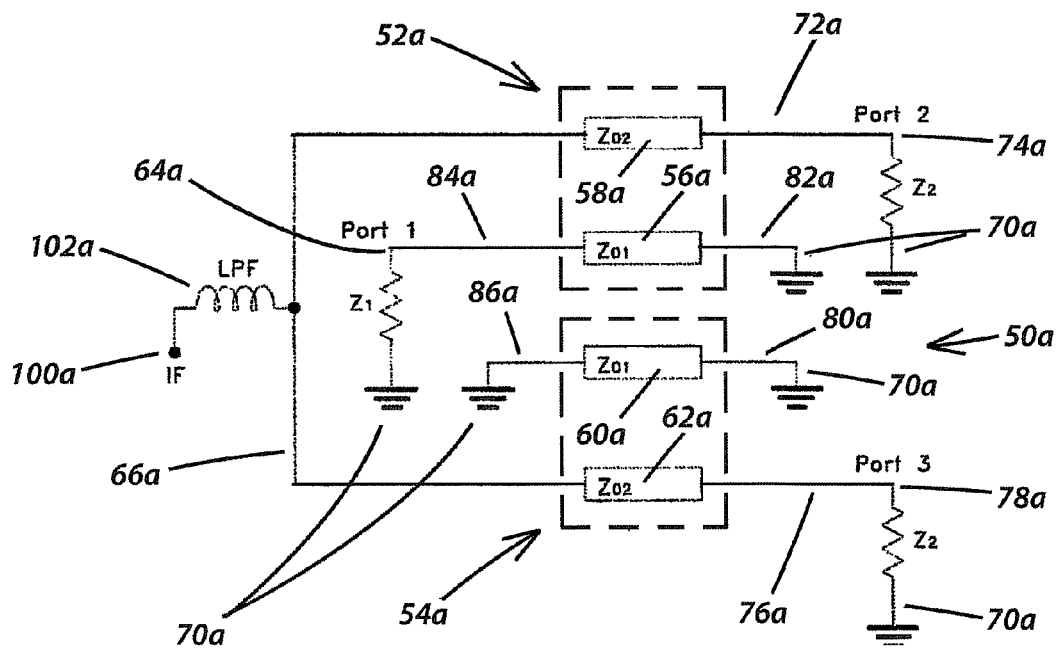
FIG. 16 shows Topology II with an unbalanced IF tap off.

There is shown in FIG. 16 a Topology II distributed or complementary type Vaisman balun 50a using asymmetrical transmission line elements. The balun 50a has a first set of coupled sections 52a and a second set of coupled sections 54a. The balun 50a has its first primary section 56a connected at one end by line 84a to port 64a, but at its other end instead of being connected directly to second primary section 60a is connected through line 82a to ground at 70a. Both ends of second primary section 60a are connected to ground 70a, through lines 80a and 86a. The ends of each secondary sections 58a and 62a, connect through lines 72a and 76a to ports 74a and 78a respectively. However, the other ends of each secondary sections 58a and 62a are not connected to ground as was the case with the balun 10 of FIG. 1, but are connected to each other through line 66a. Other than those specific differences, the balun shown in FIG. 16 has similar connections as the balun shown in FIG. 15. Lowpass filter inductor 102a connects from line 66a to the IF port 100a.

Figure 17:
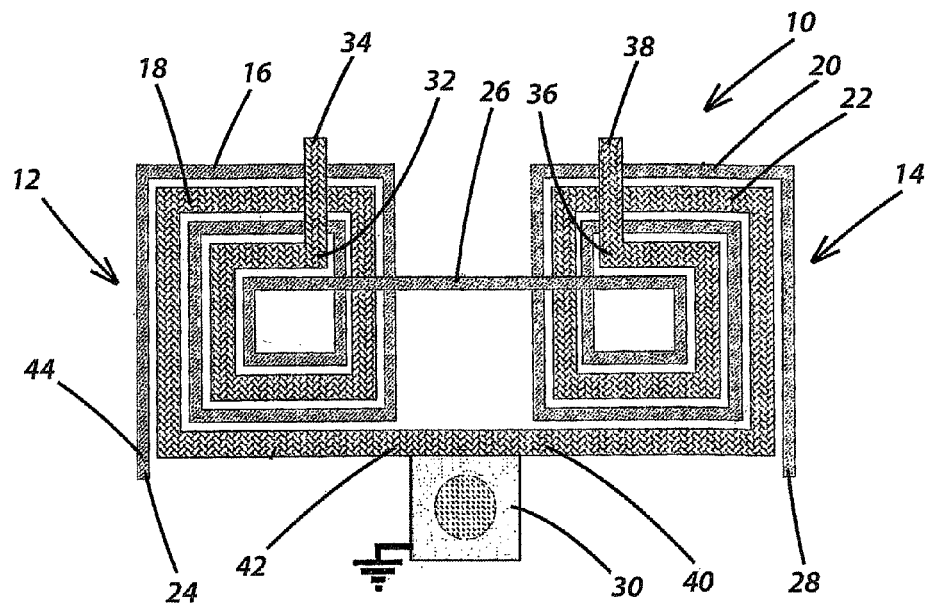
FIG. 17 shows a Topology I Vaisman balun microstrip layout.

There is shown in FIG. 17 a realization of a Topology I Vaisman balun 10 using asymmetrical transmission line elements. Not shown is the necessary insulation where lines cross over each other. This is the balun of FIG. 1, where the asymmetrical structure of the transmission line sections can be seen. The first pair of coupled sections 12 includes first primary section 16 and first secondary section 18. The second pair of coupled sections 14 includes second primary section 20 and second secondary section 22. Starting at input port 24, there is a conductive path through line 44 to first primary section 16, continuing through line 26 to second primary section 20 and terminating at open end 28. Starting at balanced or differential port 34, there is a conductive path through end 32 to first secondary section 18, continuing through end 42 to ground 30. Starting at balanced or differential port 38, there is a conductive path through end 36 to second secondary section 22, continuing through end 40 to ground 30.

Figure 18:
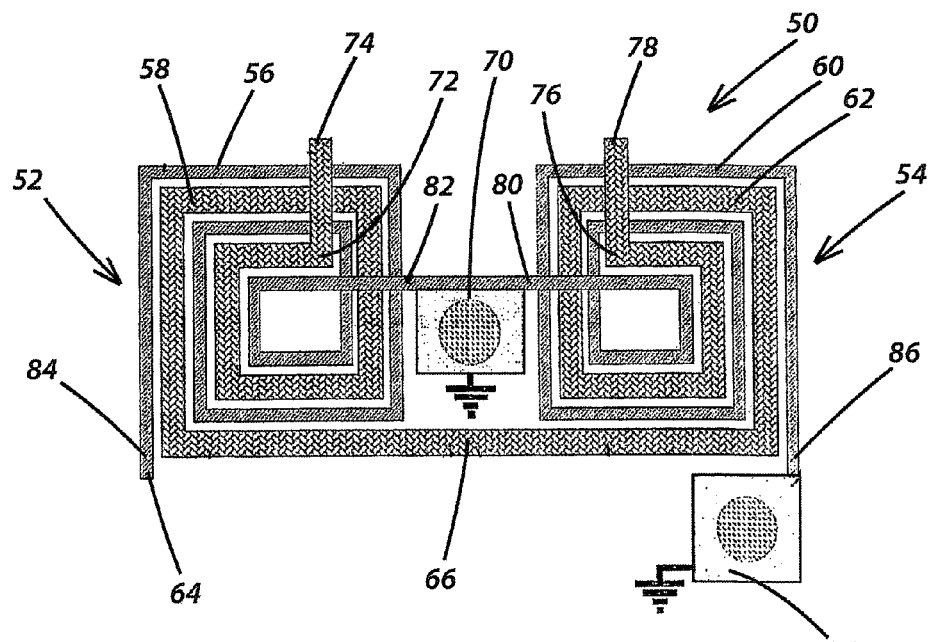
FIG. 18 shows a Topology II Vaisman balun microstrip layout.

There is shown in FIG. 18 a realization of a Topology II Vaisman balun 50 using asymmetrical transmission line elements. Not shown is the necessary insulation where lines cross over each other. This is the balun of FIG. 2, where the asymmetrical structure of the transmission line sections can be seen. The first pair of coupled sections 52 includes first primary section 56 and first secondary section 58. The second pair of coupled sections 54 includes second primary section 60 and second secondary section 62. Starting at port 64, there is a conductive path through line 84 to first primary section 56, continuing through line 82 to ground 70. Both ends of second primary section 60 are connected to ground 70, through lines 80 and 86. Starting at port 74, there is a conductive path through line 72 to first secondary section 58, continuing through line 66 to second secondary section 62, and continuing through line 76 to port 78.

The method of forming a balun with asymmetric coupled lines of the invention comprises the steps of selecting a dielectric substrate, selecting a conductive material to be applied upon the dielectric substrate in order to form primary coupled lines and secondary coupled lines, selecting a dielectric medium to cover the primary coupled lines and the secondary coupled lines, calculating the parameters of an optimal cross-sectional area for the primary coupled lines and a different optimal cross-sectional area for the secondary coupled lines, and then manufacturing the balun with the selected materials and the calculated parameters. If different dielectric mediums are used, then a first dielectric medium is selected to cover the primary coupled lines and a second dielectric medium is selected to cover the secondary coupled lines. Optionally, the conductive material may be embedded within the dielectric substrate. Additional steps include pairing primary and secondary coupled lines in order to form pairs of couplers, selecting a center operating frequency, designing each coupled line to be ¼ wavelength in length, selecting characteristic impedances for the primary and secondary coupled lines, and fine tuning the spacing between the primary and secondary coupled lines in order to obtain the optimal coupling condition.

For a Topology I Vaisman balun, further steps of the method also include connecting the primary coupled lines in series, connecting the secondary coupled lines each to ground, and determining the optimum coefficient of coupling by using the equation:

$$k_{opt,I} = \frac{\sqrt{Z_{01}} \sqrt{Z_{02}}}{\sqrt{2Z_{01}Z_{02} + 2Z_1 Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

For a Topology II Vaisman balun, further steps of the method also include connecting the secondary coupled lines in series, connecting the primary coupled lines each to ground, and determining the optimum coefficient of coupling by using the equation:

$$k_{opt,II} = \frac{\sqrt{2} \sqrt{Z_{01}} \sqrt{Z_{02}}}{\sqrt{2Z_{01}Z_{02} + Z_1 Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

The present invention provides a superior optimized balun performance when employed with other circuit elements which are either mismatched by more than 85% with respect to the system's impedance, have a dynamic impedance or differ on the impedance values among them and are all connected to the outputs of the balun. For example, in the case of mixers and multipliers, the nonlinear components are connected to the outputs of the balun presenting highly mismatched values of impedance at their corresponding reference planes. The Vaisman balun minimizes the impact of the impedance variation of the integrated diodes or transistors that must be used in these architectures by supporting a greater number of design related degrees of freedom and providing an improved matching capability. In summary, the Vaisman balun has the unique ability to accommodate impedance mismatch without requiring the incorporation of an impedance matching network.

Additionally, the present invention provides tighter control on phase velocity in the "C" and "π" asymmetric modes which results in superior phase, amplitude balance and isolation performance when compared to the values obtained by employing symmetrical coupled transmission lines, especially, when implemented in inhomogeneous planar/Quasi-TEM technologies such as microstrip and coplanar wave guide which are the primary types used in semiconductor, LTCC and PCB constructions.

In the above description of the Vaisman baluns and microwave devices of this invention, various configurations are described and applications thereof in corresponding systems are provided. Because many varying and different embodiments may be made within the scope of the inventive concept herein taught, and because many modifications may be made in the embodiments herein detailed in accordance with the descriptive requirement of the law, it is to be understood that the details herein are to be interpreted as illustrative and not in a limiting sense.

What is claimed is:

1. A planar balun comprising: a balun input; a first balun output; a second balun output; two primary coupled lines with a first cross-sectional area disposed on a first dielectric medium; two secondary coupled lines with a second cross-sectional area, the secondary coupled lines disposed on a second dielectric medium; each of the primary coupled lines being coupled to one of the secondary coupled lines with a predetermined uniform surface space therebetween; and the first cross-sectional area and the second cross-sectional area being unequal, thereby producing pairs of asymmetric coupled lines; wherein the primary coupled lines are embedded in the first dielectric medium; and wherein the secondary coupled lines are embedded in the second dielectric medium.

2. The planar balun as described in claim 1, wherein the primary coupled lines are embedded in the first dielectric medium;
wherein the first dielectric medium comprises a portion of a first inhomogeneous medium;
wherein the secondary coupled lines are embedded in the second dielectric medium; and
wherein the second dielectric medium comprises a portion of a second inhomogeneous medium.

3. The planar balun as described in claim 1, wherein the first dielectric medium includes a first dielectric substrate and the second dielectric medium includes a second dielectric substrate.

4. The planar balun as described in claim 1, wherein the primary coupled lines are overlaid upon a first dielectric substrate comprising a portion of a first inhomogeneous medium; and
wherein the secondary coupled lines are overlaid upon a second dielectric substrate comprising a portion of a second inhomogeneous medium.

5. The planar balun as described in claim 2, wherein the first inhomogeneous medium and the second inhomogeneous medium are identical.

6. The planar balun as described in claim 4, wherein the first inhomogeneous medium and the second inhomogeneous medium are identical.

7. The planar balun as described in claim 1, wherein the balun has a selected center operating frequency and further comprises:
a pair of couplers each formed from one of the primary coupled lines and one of the secondary coupled lines, with each coupled line being ¼ wavelength in length.

8. The planar balun as described in claim 7, wherein the primary coupled lines from each one of the pair of couplers are connected together in series and the secondary coupled lines are connected to ground.

9. The planar balun as described in claim 8, wherein the optimum coefficient of coupling is determined by the equation:

$$k_{opt,I} = \frac{\sqrt{Z_{01}}\sqrt{Z_{02}}}{\sqrt{Z_{01}Z_{02} + 2Z_1 Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

10. The planar balun as described in claim 7, wherein the secondary coupled lines from each one of the pair of couplers is connected together in series and the primary coupled lines are connected to ground.

11. The planar balun as described in claim 10, wherein the optimum coefficient of coupling is determined by the equation:

$$k_{opt,II} = \frac{\sqrt{2}\sqrt{Z_{01}}\sqrt{Z_{02}}}{\sqrt{2Z_{01}Z_{02} + Z_1 Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

12. The planar balun as described in claim 3, wherein the first dielectric substrate and second dielectric substrate are selected from the group consisting of LTCC material, integrated circuit dielectric substrate material, or pc board material.

13. The planar balun as described in claim 3, wherein the portion of the first dielectric medium and the second dielectric medium other than the first dielectric substrate and the second dielectric substrate are selected from the group consisting of LTCC material, integrated circuit dielectric material, pc board material, pc board type solder mask, or air.

14. A method of forming a balun with asymmetric coupled lines, wherein the balun comprises: a balun input; a first balun output; a second balun output; two primary coupled lines with a first cross-sectional area disposed on a first dielectric medium; two secondary coupled lines with a second cross-sectional area, the secondary coupled lines disposed on a second dielectric medium; each of the primary coupled lines being coupled to one of the secondary coupled lines with a predetermined uniform surface space therebetween; and the first cross-sectional area and the second cross-sectional area being unequal, thereby producing pairs of asymmetric coupled lines; wherein the primary coupled lines are embedded in the first dielectric medium; and wherein the secondary coupled lines are embedded in the second dielectric medium; the method comprising the steps of: selecting a dielectric substrate; selecting a conductive material to be applied upon the dielectric substrate in order to form the primary coupled lines and the secondary coupled lines; selecting a dielectric medium to cover the primary coupled lines and the secondary coupled lines; calculating parameters including an optimal cross-sectional area for the primary coupled lines and a different optimal cross-sectional area for the secondary coupled lines; and manufacturing the balun with the selected materials and the calculated parameters.

15. The method of claim 14, wherein a first dielectric medium is selected to cover the primary coupled lines and a second dielectric medium is selected to cover the secondary coupled lines.

16. The method of claim 14, wherein the conductive material is selected to be embedded within the dielectric substrate.

17. The method of claim 14, further comprising the steps of:
pairing primary and secondary coupled lines in order to form pairs of couplers;
selecting a center operating frequency; and
designing each coupled line to be ¼ wavelength in length.

18. The method of claim 17, further comprising the steps of:
selecting characteristic impedances for the primary and secondary coupled lines; and
fine tuning the spacing between the primary and secondary coupled lines in order to obtain the optimal coupling condition.

19. The method of claim 18, further comprising the steps of:
connecting the primary coupled lines in series; and
connecting the secondary coupled lines each to ground.

20. The method of claim 19, further comprising the step of determining the optimum coefficient of coupling by using the equation:

$$k_{opt,I} = \frac{\sqrt{Z_{01}} \sqrt{Z_{02}}}{\sqrt{Z_{01}Z_{02} + 2Z_1 Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

21. The method of claim 18, further comprising the steps of:
connecting the secondary coupled lines in series; and
connecting the primary coupled lines each to ground.

22. The method of claim 21, further comprising the step of determining the optimum coefficient of coupling by using the equation:

$$k_{opt,II} = \frac{\sqrt{2} \sqrt{Z_{01}} \sqrt{Z_{02}}}{\sqrt{2Z_{01}Z_{02} + Z_1 Z_2}}$$

wherein $Z_{01}$ is the characteristic impedance of the primary coupled line, $Z_{02}$ is the characteristic impedance of the secondary coupled line, $Z_1$ is the source impedance, and $Z_2$ is the output impedance.

* * * * *